(12) United States Patent
Robinson et al.

(10) Patent No.: US 10,732,727 B2
(45) Date of Patent: Aug. 4, 2020

(54) MECHANICALLY ADAPTABLE PRESSABLE USER INPUT DEVICE

(71) Applicant: Microsoft Technology Licensing, LLC, Redmond, WA (US)

(72) Inventors: Jonathan Shea Robinson, Kirkland, WA (US); Aaron Schmitz, Redmond, WA (US); Gabriel Michael Rask Gassoway, Issaquah, WA (US); Andrew McKinley Schroeder, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 85 days.

(21) Appl. No.: 15/691,463

(22) Filed: Aug. 30, 2017

(65) Prior Publication Data
US 2019/0064933 A1    Feb. 28, 2019

(51) Int. Cl.
*G06F 3/02* (2006.01)
*G06F 3/0354* (2013.01)
(Continued)

(52) U.S. Cl.
CPC .......... *G06F 3/0202* (2013.01); *A63F 13/218* (2014.09); *A63F 13/24* (2014.09);
(Continued)

(58) Field of Classification Search
None
See application file for complete search history.

(56) References Cited

U.S. PATENT DOCUMENTS

| 4,913,414 A | * | 4/1990 | Traxler | B65H 31/34 |
| | | | | 271/209 |
| 5,186,768 A | * | 2/1993 | Nomoto | C21D 9/02 |
| | | | | 148/333 |

(Continued)

FOREIGN PATENT DOCUMENTS

| DE | 102013007008 A1 | 10/2014 |
| JP | 2009283414 A | 12/2009 |

OTHER PUBLICATIONS

"International Search Report and Written Opinion Issued in PCT Application No. PCT/US2018/038703", dated Oct. 9, 2018, 13 Pages.

(Continued)

*Primary Examiner* — Kent W Chang
*Assistant Examiner* — Benjamin Morales
(74) *Attorney, Agent, or Firm* — Alleman Hall Creasman & Tuttle LLP

(57) ABSTRACT

Examples are disclosed that relate to handheld input devices having pressable user input mechanisms configured to move in a manner that adapts to different hands. One disclosed example provides a handheld input device comprising a body configured to be held by a hand such that one or more fingers of the hand are curved at least partially toward a palm of the hand, a pressable user input mechanism positioned on the body at such a location as to be in contact with a palm-side surface of a finger when the handheld input device is held, and a hinge coupling between the body and the pressable user input mechanism, the hinge coupling comprising an axis of rotation that varies based upon a characteristic of force applied to the pressable user input mechanism.

20 Claims, 9 Drawing Sheets

(51) Int. Cl.
*G06F 3/0346* (2013.01)
*A63F 13/218* (2014.01)
*A63F 13/24* (2014.01)
*H03K 17/97* (2006.01)
*G06F 3/03* (2006.01)

(52) U.S. Cl.
CPC ........ *G06F 3/0346* (2013.01); *G06F 3/03547* (2013.01); *H03K 17/97* (2013.01); *G06F 3/0308* (2013.01); *H03K 2017/9713* (2013.01); *H03K 2217/96054* (2013.01)

(56) References Cited

U.S. PATENT DOCUMENTS

| | | | |
|---|---|---|---|
| 5,423,227 A | 6/1995 | Polaert et al. | |
| 7,717,306 B2 | 5/2010 | White, Sr. | |
| 8,134,091 B2 | 3/2012 | Basilico | |
| 8,894,491 B2 | 11/2014 | Grant et al. | |
| 8,897,850 B2 | 11/2014 | Jochim et al. | |
| 9,050,529 B2 | 6/2015 | Grant et al. | |
| 9,672,994 B2 | 6/2017 | Bleckmann et al. | |
| 2008/0125065 A1* | 5/2008 | Das | G08C 17/02 455/128 |
| 2010/0177033 A1* | 7/2010 | Chase | G06F 3/0202 345/156 |
| 2010/0304868 A1* | 12/2010 | Zalewski | A63F 13/42 463/38 |
| 2013/0324254 A1* | 12/2013 | Huang | G06F 3/016 463/37 |
| 2014/0315642 A1 | 10/2014 | Grant et al. | |
| 2017/0090568 A1 | 3/2017 | Chen et al. | |
| 2017/0092446 A1* | 3/2017 | Schmitz | A63F 13/24 |
| 2019/0095011 A1* | 3/2019 | Lindahl | B60R 1/12 |

OTHER PUBLICATIONS

"Modsticks Pro Triggers—Black", Retrieved From<<http://modsticks.com/modsticks-pro-triggers-black/>>, Mar. 9, 2014, 3 pages.

* cited by examiner

US 10,732,727 B2

MECHANICALLY ADAPTABLE PRESSABLE USER INPUT DEVICE

BACKGROUND

Handheld input devices may be used to provide user input to many types of computing devices. Some handheld input devices may include multiple input mechanisms, such as multiple buttons positioned to be operable by different fingers.

SUMMARY

Examples are disclosed that relate to handheld input devices having pressable user input mechanisms configured to move in a manner that adapts to different hands. One disclosed example provides a handheld input device comprising a body configured to be held by a hand such that one or more fingers of the hand are curved at least partially toward a palm of the hand, a pressable user input mechanism positioned on the body at such a location as to be in contact with a palm-side surface of a finger when the handheld input device is held, and a hinge coupling between the body and the pressable user input mechanism, the hinge coupling comprising an axis of rotation that varies based upon a characteristic of force applied to the pressable user input mechanism.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As mentioned above, handheld input devices may provide input to various computing devices, such as video game consoles, virtual reality display systems, and augmented reality display systems. Some handheld input devices may include multiple input mechanisms, such as multiple buttons positioned to be operable by different fingers. However, hands of different sizes may fit a handheld input device differently. As such, a pressable user input mechanism may align differently with fingers of different users. Where the pressable user input mechanism has a fixed path of motion, such a pressable user input mechanism may not follow the natural motion of some users' fingers.

Accordingly, examples are disclosed that may allow a pressable user interface mechanism to adapt to a natural motion of different hands and fingers compared to mechanisms having fixed paths of motion. Briefly, the disclosed examples utilize a hinge coupling comprising an axis of rotation that varies in location based upon the characteristics of a force applied between the pressable user input mechanism and the body of the handheld input device. This allows the pressable user input mechanism to feel as if it is naturally rotating with the user's finger, which may create a more natural and ergonomic experience. Such a hinge may be referred to in some examples as a living hinge.

Figure 1:
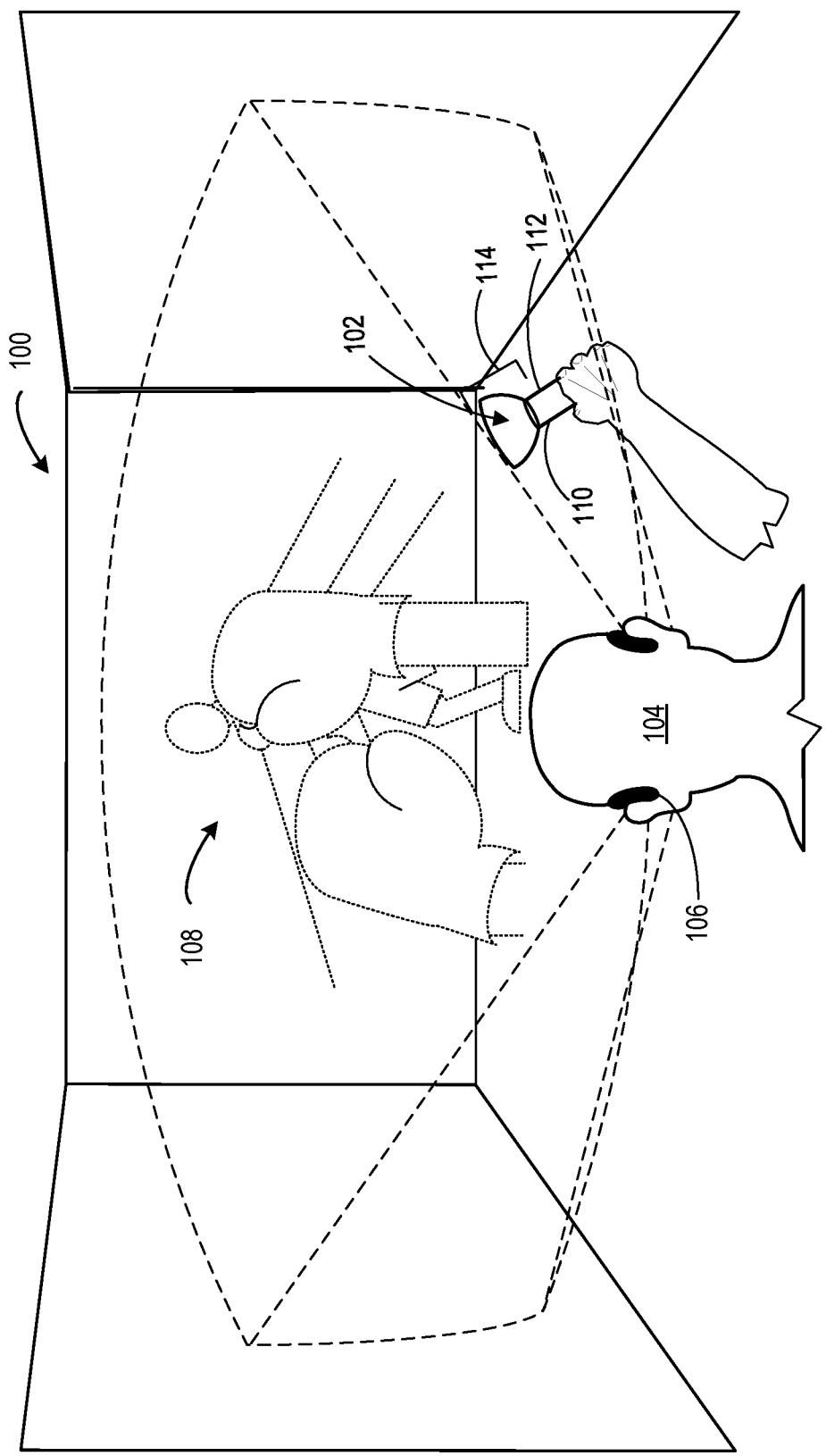
FIG. 1 shows an example use scenario in which a user grasps a handheld input device.

FIG. 1 shows an example scenario 100 in which a handheld input device 102, held by a user 104, provides input to a virtual or augmented reality head mounted display 106 to control a virtual reality experience 108. The handheld input device 102 comprises a body 110 having a grip portion 112 and an optical tracking portion 114, wherein the optical tracking portion 114 may comprise features (e.g. an arrangement of light sources) useable to optically track a position and orientation of the handheld input device 102 via a camera external to the handheld input device 102. In other examples, the optical tracking portion 114 may be omitted.

The grip portion 112 of the handheld input device 102 comprises one or more pressable user input mechanisms, examples of which are described in more detail below, positioned along the grip portion 112 of the handheld input device 102 to be operable by fingers of a hand holding the grip portion 112. The pressable user input mechanism takes the form of a button, a trigger, or other pressable mechanism in various examples. The handheld user input device 102 also may include one or more other input controls not shown in this example, such as a thumbstick, directional pad, and/or touch sensor. Further, a handheld user input device may include a plurality of pressable user input mechanisms to be operable by a plurality of fingers of the hand holding the grip portion 112. The term "handheld user input device" is used herein to signify that the user input device is configured to be held during use, and not whether the user input device is currently in the state of being held in a hand. While depicted in FIG. 1 as a controller for a virtual or augmented reality display system, in other examples, a handheld user input device may take any other suitable form for controlling any other suitable type of computing device, such as a video game console.

Figure 2:
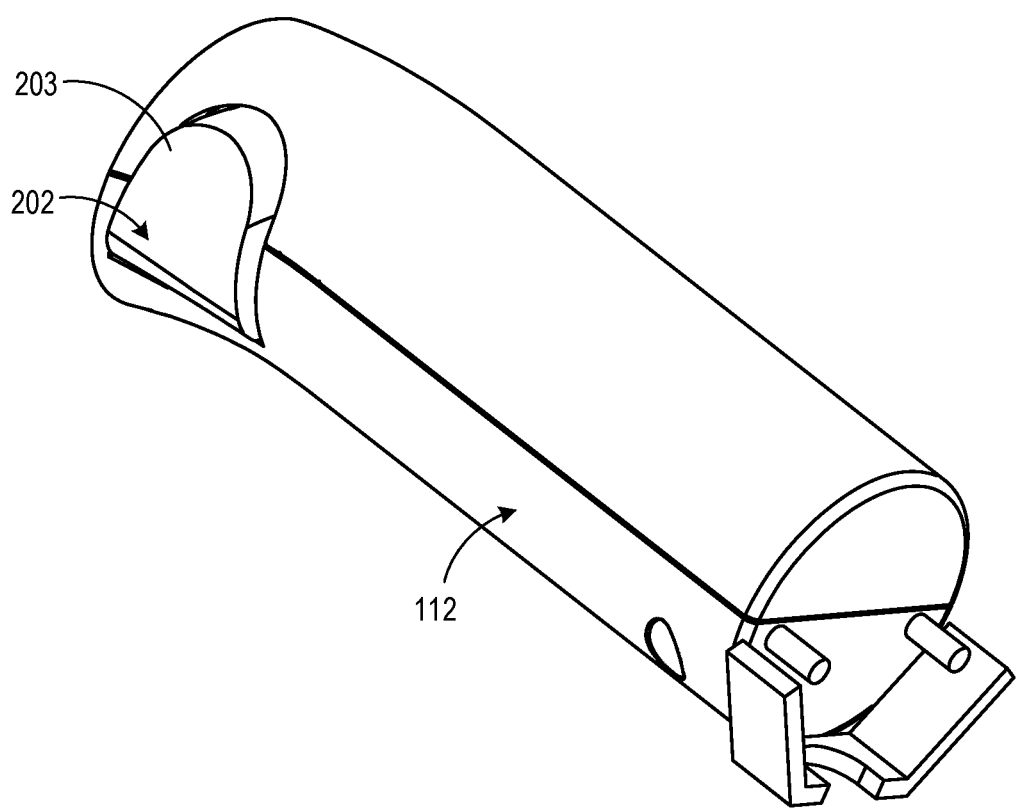
FIG. 2 shows an example pressable user input mechanism positioned on the body of a handheld input device.

FIG. 2 shows an example pressable user input mechanism 202 positioned on the grip portion 112 of the handheld input device 102. In FIG. 2, the pressable user input mechanism 202 is positioned to be in contact with a palm side surface of a finger when the grip portion 112 is held in a hand. In this example, the pressable user input mechanism 202 comprises a button 203 positioned to be beneath an index finger of a user's hand when the handheld input device 102 is grasped, but may be positioned to be beneath other fingers in other examples. The optical tracking portion 114 of the handheld input device 102 is omitted from FIG. 2 for clarity.

Figure 3:
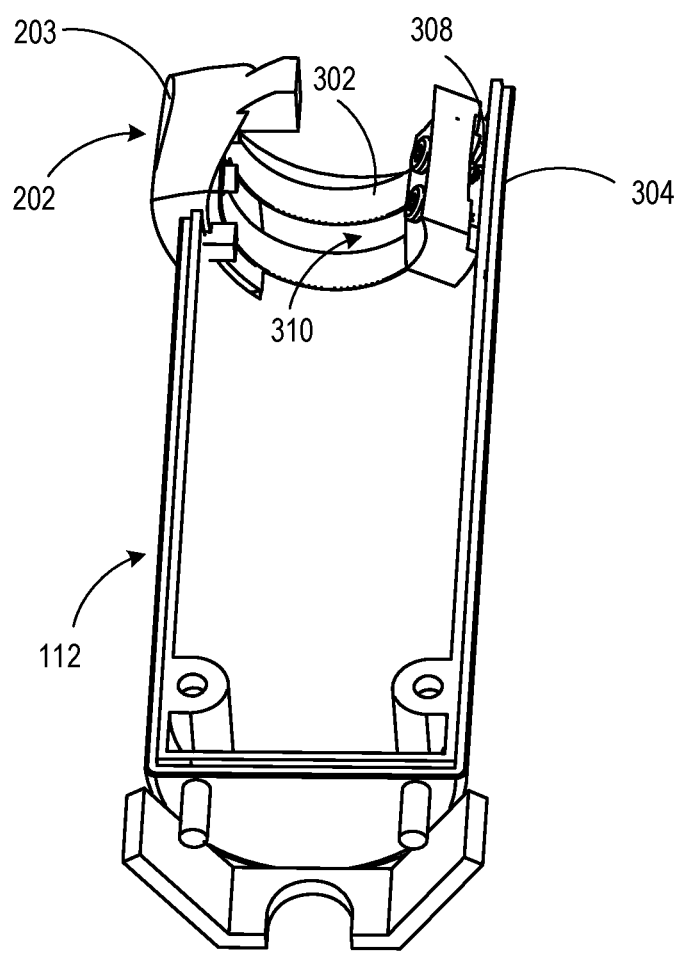
FIG. 3 shows an example hinge coupling between a body and pressable user input mechanism of the example of FIG. 2.

FIG. 3 shows a view of an interior of grip portion 112, and illustrates an example hinge coupling between pressable user interface mechanism 202 and body 110. Hinge coupling comprises a curved spring 302 positioned mechanically between pressable user input mechanism 202 and an opposing interior surface 308 of body 110, which in this example is an inner surface of an outer wall 304 of the grip portion 112. Curved spring 302 is configured such that an axis of rotation of pressable user interface mechanism 202 differs based upon a characteristic of a force applied to the pressable user interface mechanism by a user's finger, such as a direction of the force based upon a natural motion of the user's finger and/or a location at which the force is applied. Thus, as a user actuates pressable user interface mechanism 202, the axis of rotation moves towards the user's finger as curved spring 302 bends so that pressable user interface mechanism 202 can follow the natural path of motion of the user's finger and also the natural orientation of the tip of the user's finger as the user's finger closes towards and opens away from the user's palm.

Figure 4:
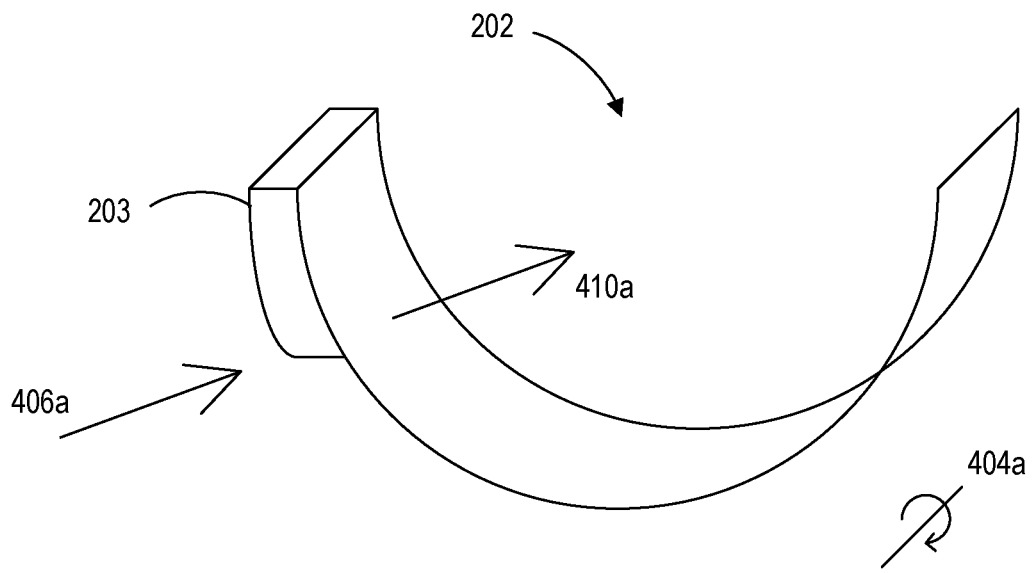
FIG. 4 schematically illustrates varying of a location of an axis of rotation based upon a characteristic of force applied to the pressable user input mechanism of FIG. 2.
Figure 4:
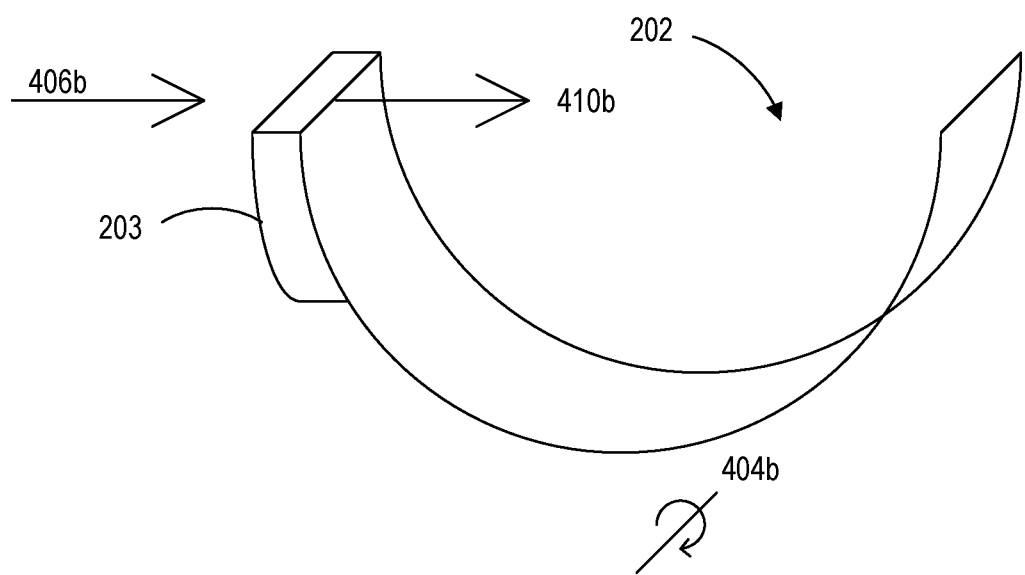

FIG. 4 schematically illustrates an example of a variation in a location of an axis of rotation based on a characteristic of force (illustrated by arrow 406) applied, such as a direction and location of the applied force. As previously discussed, hands of different sizes may fit a handheld input device differently. For example, one user may press button 203 with force 406a directed at the bottom of button 203, causing hinge coupling 402 to flex along vector 410a, resulting in rotation of button 203 about axis 404a. However, a different user may press button 203 with force 406b directed at the top of button 203, causing hinge coupling 402 to flex along vector 410b, resulting in rotation of button 203 about axis 404b. The axis of rotation 404 also may shift during a user input as button 203 is moved by the user's finger. In this manner, the motion of the button in response to pushing may accommodate the natural movement path of the fingers of many different users. As shown in FIG. 4, pressable user interface mechanism 202 provides a path of motion with a large radius of curvature to an axis of rotation 404 outside of body 110 which cannot be achieved with a traditional pin-in-hole hinge. This allows pressable user interface mechanism 202 to more accurately follow the natural path of motion of the user's finger. In other embodiments, pressable user interface mechanism 202 may provide a path of motion with a smaller radius of curvature that extends to an axis of rotation inside of body 110.

Referring again to FIG. 3, in some examples, spring 302 may be deflected from its natural shape in a rest position to provide opposing force at the beginning of a press actuation, and to provide a sensation of a relatively uniform force profile throughout a range of motion. In some such examples, spring 302 may provide the only force returning button 203 to its rest position. In other such examples, spring 302 may be aided in returning button 203 by another spring or a tactile switch or other mechanism suitable to push button 203 towards its rest position. In other examples, spring 302 may not be deflected from its natural shape in the rest position, but rather may be neutral, which may allow spring 302 to provide return force whether pulled or pushed.

Spring 302 may be formed from any suitable material or materials. Suitable materials include materials having high yield strength that may undergo a sufficiently large number of flex cycles without failing in view of a desired product lifetime. Examples include sheet metal (for example, steel or spring steel), various polymers such as polypropylene, polyoxymethylene, polyvinyl chloride and polycarbonate, and various composite materials. Spring 302 may be formed through any suitable process or processes. Examples include stamping, injection molding or metal injection molding, extrusion, and die cutting.

In some examples, spring 302 may have substantially parallel sides and/or uniform thickness, and/or a continuous structure, without any openings. In other examples, spring 302 may have other suitable configurations, such as one or more of openings (e.g. opening 310), a varying thickness, and/or a varying width. Such features may change the local spring constant and thereby determine where the spring is more or less resistive to bending, and thus may bias the motion of pressable user input mechanism 202 when actuated by a user.

Figure 5:
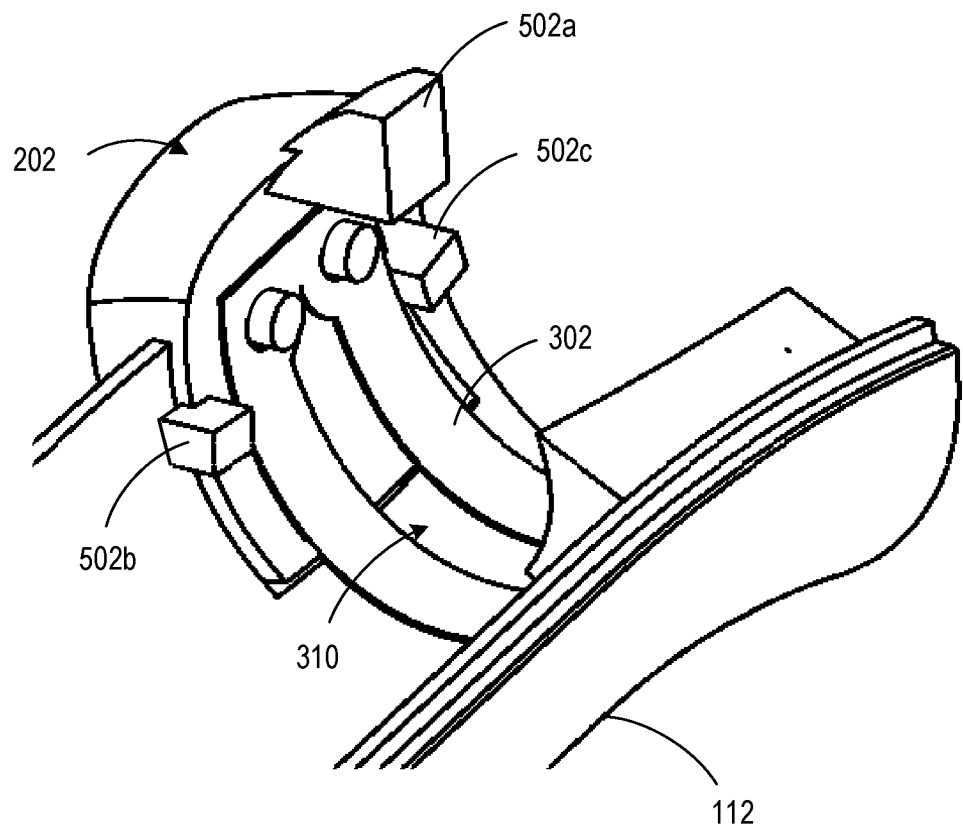
FIG. 5 shows example mechanical constraints configured to restrict motion of a pressable user input mechanism.

FIG. 5 shows opening 310 in more detail. In the depicted example, opening 310 extends along a substantial portion of a length of spring 302. In other examples, any other suitable opening configuration may be used, including configurations with multiple openings. Further, in some examples, a spring and/or an opening may have a varying width along its length. This may allow a spring constant and a torsional rigidity to be configured as desired.

The motion of pressable user input mechanism 202 may be restricted by one or more mechanical constraints positioned on one or more of the pressable user input mechanism 202 and body 110 of the device. Example constraints are shown at 502a, 502b and 502c in FIG. 5 as out-stops configured to prevent pressable user input mechanism 202 from moving past a set position outside of body 110 of the device. Out-stops 502a-c may be used, for example, where spring 302 of the hinge coupling is under pre-compression, as described above. Although not illustrated in FIG. 5, mechanical constraints 502a-c may also include in-stops that help prevent pressable user input mechanism 202 from moving past a set position inside of body 110 of the device. Mechanical constraints also may be included to restrict lateral or torsional motion of spring 302.

Figure 6:
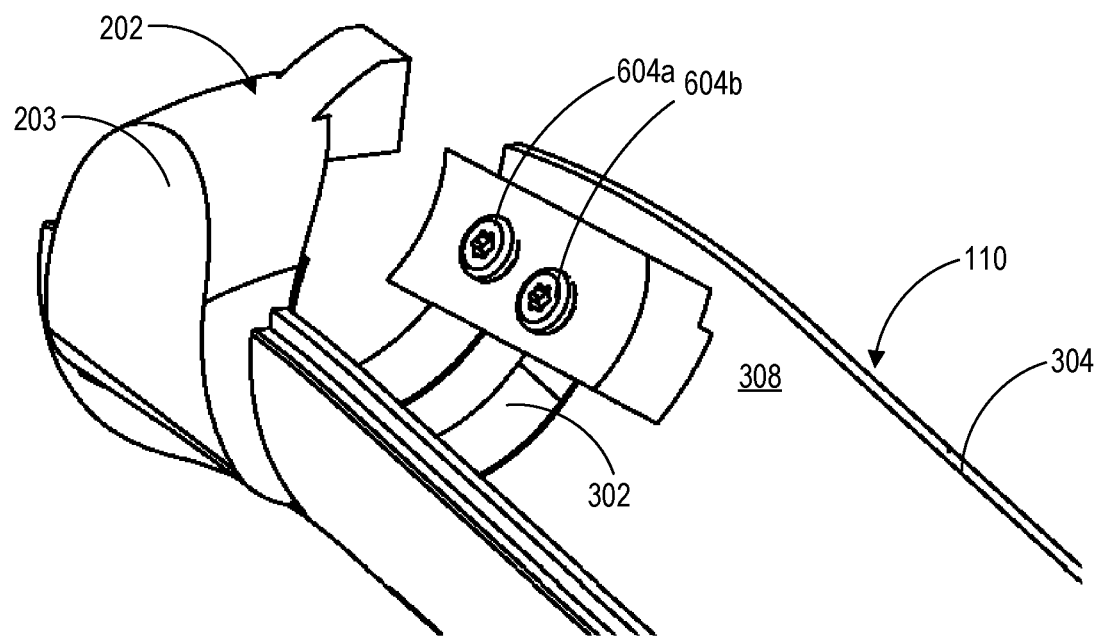
FIG. 6 shows an example of a spring attached to an inner surface of a wall of a handheld input device.

Spring 302 may be secured within body 110 and to button 203 in any suitable manner. FIG. 6. illustrates an example in which the spring is attached to body 110 by screws 604a and 604b. In this example, spring 302 extends between button 203 and an opposing interior surface 602 of body 110. A width of the spring 302 where it attaches to the interior wall may be made wider or narrower to vary a torsional movement range of spring 302. In other examples, spring 302 may be attached to an interior surface of body 110 in any other suitable manner, such as by one or more of one or more of heat baking, heat staking, melting, snaps, and adhesive materials. In yet other examples, spring 302 may be molded as a unitary part with one or more of pressable user input mechanism 202 and outer wall 304 of the handheld input device. In other examples, spring 302 may be captured by another part separate from body 110 that constrains spring 302 within body 110.

Figure 7:
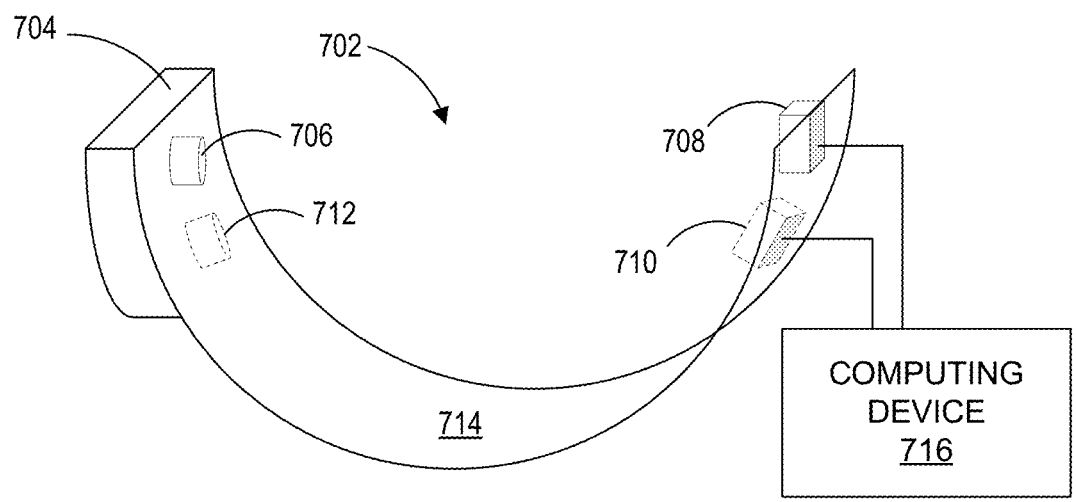
FIG. 7 shows an example sensor arrangement configured to detect three or more actuation states of the pressable user input mechanism of the example of FIG. 2.

A pressable user input mechanism may include one or more sensors to sense motion of the input mechanism from user actuations. Any suitable sensor or sensors may be used to detect actuation of a pressable user input mechanism. In some examples, a contact switch or other two-state sensing mechanism may be used to distinguish between two actuation states (e.g. off/on). In other examples, a sensor arrangement may be used that is configured to detect three or more actuation states of pressable user input mechanism 702. FIG. 7 schematically shows an example pressable user input mechanism 702 comprising a sensor arrangement configured to detect three or more actuation states of a pressable user input mechanism. In this example, a Hall effect sensing system is illustrated in which a magnet 706 is coupled to a first side of spring 714 and a Hall effect sensor 708 is coupled to another side. Such a sensor arrangement may allow detection, for example, of a continuous range of motion when a user presses a button 704 of the pressable user interface mechanism 702.

As a location of the axis of rotation of button 704 may differ for different users, the use of a single magnet and/or single sensor may pose challenges with regard to interpreting user inputs in examples where a continuous range of actuation states (or relatively finely separated discrete states) are utilized. As such, one or more additional sensors 710 and/or one or more additional magnets 712 may be used to provide more information on the characteristics of the motion of pressable user interface mechanism 702. For example, if a first user pushes button 704 in a more upwardly direction than a second user, such that magnet 706 does not move as close to sensor 704 for the first user than the second user (even where the actual path of motion was a same distance), the inputs may be interpreted differently. However, the use of two or more magnets and/or two or more sensors may provide additional information that can be used to help mitigate such an issue. As a more specific example, two magnets located at different locations on a spring may both influence a single Hall effect sensor or other magnetic sensors. In such an arrangement, the combined effect of the magnets on the Hall effect sensor may provide a more accurate representation of the input motion than a single magnet. As another example, one or more magnets may be used with two or more Hall effect sensors, and outputs from the sensors may be computationally combined (e.g. via a computing device 716 that may be local to or remote from handheld input device 102) to produce a combined signal that provides a more accurate representation of the motion. In other examples, any other suitable sensor or sensors than Hall effect sensors may be used to detect three or more actuation states. Examples include one or more potentiometers, strain gauges, capacitive sensors, and/or optical sensors.

Figure 8:
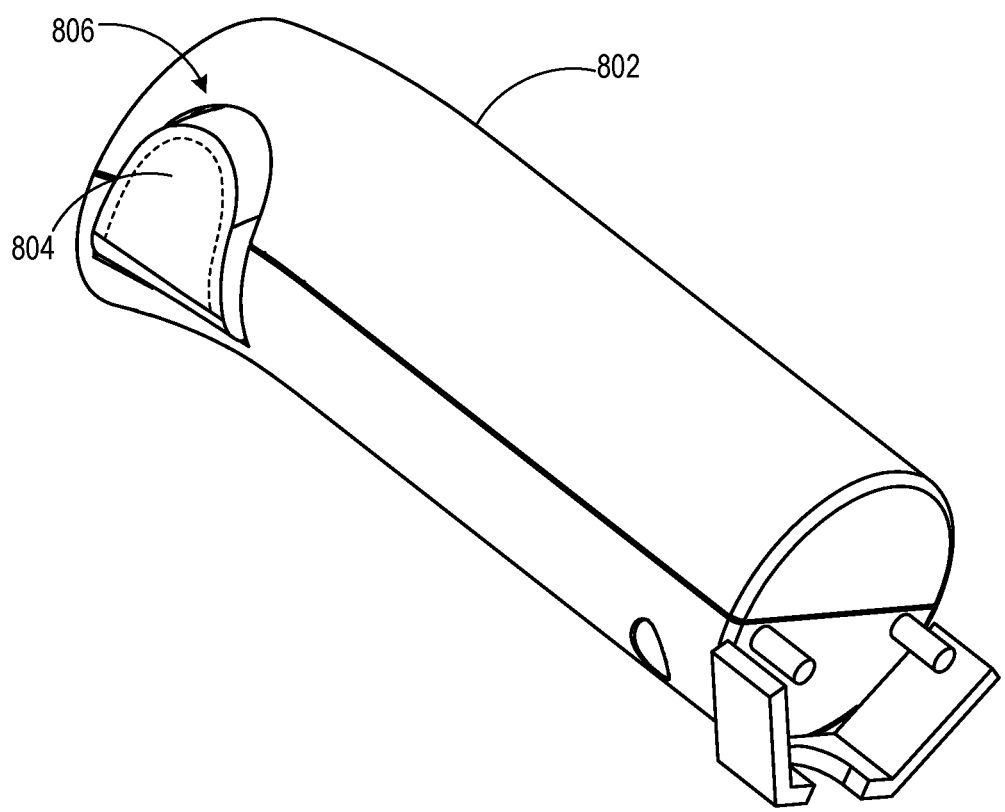
FIG. 8 shows an example pressable user input mechanism comprising a touch sensor.

In some examples, a pressable user input mechanism may include additional functionalities. For example, FIG. 8 shows a handheld user input device 802 that comprises a touch sensor 804 positioned on a surface of pressable user input mechanism 806. Touch sensor 804 may be used to detect whether the surface of pressable user input mechanism 806 is touched, and in some examples a location at which it is touched. This may help to interpret inputs from different motion paths caused by different fingers. For example, if touch sensor 804 shows that a finger is touching only a lower portion of the touch sensor (e.g. where the finger does not extend across the entire surface of the button), then a motion path corresponding to such a touch location (e.g. as learned from training data during product development) may be selected based upon the touch sensor data combined with other sensor data, such as Hall effect sensor data. In other examples, touch sensor 804 may be used to detect a presence/absence of touch, rather than a touch location. In any of these examples, touch sensor 804 also may be used to provide input to a computing device controlled by the handheld controller, instead of or in addition to helping to interpret user input movements. For example, a displayed virtual hand may be moved between an open and closed state based upon whether a user is touching touch sensor 804. Further, touch sensor 804 also may be used to detect hover inputs in which a finger is held close to the touch sensor without contacting the touch sensor, where the touch sensor uses a capacitive sensing mechanism. In other examples, a resistive touch sensing mechanism may be used. One or more of such touch sensors 804 may detect a user's finger hovering over the surface of pressable user input mechanism 806. One or more touch sensors 804 may be used to determine the position of the user's finger on pressable user input mechanism 806. Touch sensors 804 may include one or more of capacitive, motion or pressure sensors.

Thus, the disclosed examples may allow a pressable user input device to comfortably follow the natural motion paths of the hands of a wide variety of users. In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
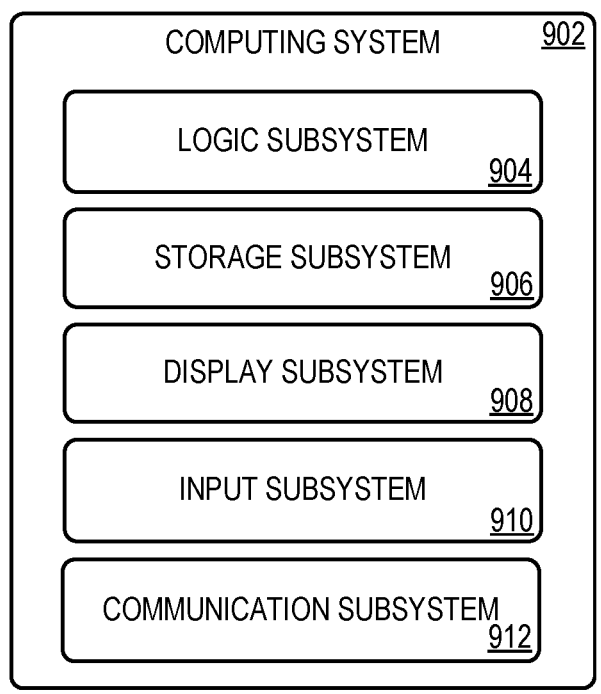
FIG. 9 shows a block diagram of an example computing device.

FIG. 9 schematically shows a non-limiting embodiment of a computing system 902 that can enact one or more of the methods and processes described above. Computing system 902 is shown in simplified form. Computing system 902 may take the form of one or more personal computers, server computers, tablet computers, home-entertainment computers, network computing devices, gaming devices, mobile computing devices, mobile communication devices (e.g., smart phone), and/or other computing devices. The handheld user input device embodiments described above are examples of such computing devices.

Computing system 902 includes a logic subsystem 904 and a storage subsystem 906. Computing system 902 may optionally include a display subsystem 908, input subsystem 910, communication subsystem 912, and/or other components not shown in FIG. 9.

Logic subsystem 904 includes one or more physical devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem may include one or more processors configured to execute software instructions. Additionally or alternatively, the logic subsystem may include one or more hardware or firmware logic machines configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely accessible, networked computing devices configured in a cloud-computing configuration.

Storage subsystem 906 includes one or more physical devices configured to hold instructions executable by the logic subsystem to implement the methods and processes described herein. When such methods and processes are implemented, the state of storage subsystem 906 may be transformed—e.g., to hold different data.

Storage subsystem 906 may include removable and/or built-in devices. Storage subsystem 906 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 906 may include volatile, nonvolatile, dynamic, static, read/write, read-only, random-access, sequential-access, location-addressable, file-addressable, and/or content-addressable devices.

It will be appreciated that storage subsystem 906 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 904 and storage subsystem 906 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 908 may be used to present a visual representation of data held by storage subsystem 906. This visual representation may take the form of a graphical user interface (GUI). As the herein described methods and processes change the data held by the storage subsystem, and thus transform the state of the storage subsystem, the state of display subsystem 908 may likewise be transformed to visually represent changes in the underlying data. Display subsystem 908 may include one or more display devices utilizing virtually any type of technology. Such display devices may be combined with logic subsystem 904 and/or storage subsystem 906 in a shared enclosure, or such display devices may be peripheral display devices.

Input subsystem 910 may comprise or interface with one or more user-input devices such as a keyboard, mouse, touch screen, or game controller. The pressable user input mechanism embodiments described above are examples of user input devices. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for subsystem vision and/or gesture recognition; a head tracker, eye tracker, accelerometer, and/or gyroscope for motion detection and/or intent recognition; as well as electric-field sensing componentry for assessing brain activity.

When included, communication subsystem 912 may be configured to communicatively couple computing system 902 with one or more other computing devices. Communication subsystem 912 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 902 to send and/or receive messages to and/or from other devices via a network such as the Internet.

Another example provides a handheld input device for a computing device, the handheld input device comprising a body configured to be held by a hand such that one or more fingers of the hand are curved at least partially toward a palm of the hand, a pressable user input mechanism positioned on the body at such a location as to be in contact with a palm-side surface of a finger when the handheld input device is held, and a hinge coupling between the body and the pressable user input mechanism, the hinge coupling comprising an axis of rotation that varies based upon a characteristic of force applied to the pressable user input mechanism. The handheld input device may additionally or alternatively include one or more sensors located at one or more locations operable to detect three or more actuation states of the pressable user input mechanism. The sensor or sensors may additionally or alternatively include one or more of a Hall effect sensor, a potentiometer, and a capacitive sensor to detect multiple actuation states of the pressable user input mechanism. The handheld input device may additionally or alternatively include one or more touch sensors positioned to detect touch on a surface of the pressable user input mechanism. The handheld input device may additionally or alternatively include one or more mechanical constraints positioned on one or more of the pressable user input mechanism and the body of the device to restrict the motion of the pressable user input mechanism. The hinge coupling may additionally or alternatively include a curved spring positioned mechanically between a button of the pressable user input mechanism and an opposing interior surface of the body to permit varying of an actuation path based upon characteristics of a force applied to the button. The spring may additionally or alternatively include one or more of sheet metal, spring steel and polypropylene. The spring may additionally or alternatively include one or more of a varying width along a length of the spring and an opening formed through the spring. The hinge coupling may additionally or alternatively include a spring attached to an inner surface of the outer wall. The hinge coupling may additionally or alternatively include a spring that is deflected from its natural shape at rest.

Another example provides a handheld input device for a computing device, the handheld input device comprising a body configured to be held by a hand such that one or more fingers of the hand are curved at least partially toward a palm of the hand when held, a pressable user input mechanism positioned on the body at such a location as to be in contact with a palm-side surface of a finger when the handheld input device is held, and a hinge coupling between the pressable user input mechanism and the body, the hinge comprising a curved spring positioned mechanically between a button of the pressable user input mechanism and an opposing interior surface of the body to permit varying of an actuation path based upon characteristics of a force applied to the button. The handheld input device may additionally or alternatively include one or more sensors positioned to detect three or more actuation states of the pressable user input mechanism. The sensor may additionally or alternatively include a magnet attached to the pressable user input mechanism and a Hall effect sensor on an opposing interior surface of the body. The spring may additionally or alternatively include one or more of a varying width along a length of the spring and an opening formed through the spring. The handheld input device may additionally or alternatively include a spring that is deflected from its natural shape at rest.

Another example provides a handheld input device for a computing device, the handheld input device comprising a body configured to be held by a hand such that one or more fingers of the hand are curved at least partially toward a palm of the hand when held a pressable user input mechanism positioned on the body at such a location as to be in contact with a palm-side surface of a finger when the handheld input device is held a hinge coupling between the body and the pressable user input mechanism, the hinge coupling comprising an axis of rotation that varies based upon characteristics of force applied to the pressable user input mechanism and a sensor subsystem configured to detect three or more actuation states of the pressable user interface mechanism. The sensor subsystem may additionally or alternatively include a magnet attached to the pressable user input mechanism and a Hall effect sensor on an opposing interior surface of the body. The sensor subsystem may additionally or alternatively include one or more of a plurality of magnets and a plurality of Hall effect sensors. The sensor subsystem may additionally or alternatively include one or more of a potentiometer and capacitive sensor. The handheld input device may additionally or alternatively include one or more touch sensors positioned to detect touch on a surface of the pressable user input mechanism.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A handheld input device for a computing device, the handheld input device comprising;
    a body configured to be held by a hand such that one or more fingers of the hand are curved at least partially toward a palm of the hand;
    a pressable user input mechanism positioned on the body at such a location as to be in contact with a palm-side surface of a finger when the handheld input device is held; and
    a hinge coupling between the body and the pressable user input mechanism, the hinge coupling providing different paths of motion for the pressable user input mechanism based upon a direction of force applied to the pressable user input mechanism, wherein at least two of the different paths of motion comprise one or more of a different radius of curvature and a different location of an axis of rotation around which the pressable user input mechanism rotates during movement.

2. The handheld input device of claim 1, further comprising one or more sensors located at one or more locations operable to detect three or more actuation states of the pressable user input mechanism.

3. The handheld input device of claim 2, wherein the sensor includes one or more of a Hall effect sensor, a potentiometer, and a capacitive sensor to detect multiple actuation states of the pressable user input mechanism.

4. The handheld input device of claim 1, further comprising one or more touch sensors positioned to detect touch on a surface of the pressable user input mechanism.

5. The handheld input device of claim 1, further comprising one or more mechanical constraints positioned on one or more of the pressable user input mechanism and the body of the device to restrict the motion of the pressable user input mechanism.

6. The handheld input device of claim 1, wherein the hinge coupling comprises a curved spring positioned mechanically between a button of the pressable user input mechanism and an opposing interior surface of the body to permit varying of an actuation path based upon characteristics of a force applied to the button.

7. The handheld input device of claim 6, wherein the spring comprises one or more of sheet metal, spring steel and polypropylene.

8. The handheld input device of claim 6, wherein the spring comprises one or more of a varying width along a length of the spring and an opening formed through the spring.

9. The handheld input device of claim 6, wherein the spring is attached to an inner surface of the body.

10. The handheld input device of claim 6, wherein the spring is deflected from its natural shape at rest.

11. A handheld input device for a computing device, the handheld input device comprising;
    a body configured to be held by a hand such that one or more fingers of the hand are curved at least partially toward a palm of the hand when held;
    a pressable user input mechanism positioned on the body at such a location as to be in contact with a palm-side surface of a finger when the handheld input device is held; and
    a hinge coupling between the pressable user input mechanism and the body, the hinge comprising a curved spring positioned mechanically between a button of the pressable user input mechanism and an opposing interior surface of the body, the hinge coupling providing different paths of motion for the pressable user input mechanism based upon a direction of a force applied to the button, wherein at least two of the different paths of motion comprise one or more of a different radius of curvature and a different location of an axis of rotation around which the pressable user input mechanism rotates during movement.

12. The handheld input device of claim 11, further comprising one or more sensors positioned to detect three or more actuation states of the pressable user input mechanism.

13. The handheld input device of claim 12, wherein the sensor includes a magnet attached to the pressable user input mechanism and a Hall effect sensor on the opposing interior surface of the body.

14. The handheld input device of claim 11, wherein the spring comprises one or more of a varying width along a length of the spring and an opening formed through the spring.

15. The handheld input device of claim 11, wherein the spring is deflected from its natural shape at rest.

16. A handheld input device for a computing device, the handheld input device comprising;
    a body configured to be held by a hand such that one or more fingers of the hand are curved at least partially toward a palm of the hand when held;
    a pressable user input mechanism positioned on the body at such a location as to be in contact with a palm-side surface of a finger when the handheld input device is held;
    a hinge coupling between the body and the pressable user input mechanism, the hinge coupling providing different paths of motion for the pressable user input mechanism based upon a direction of force applied to the pressable user input mechanism, wherein at least two of the different paths of motion comprise one or more of a different radius of curvature and a different location of an axis of rotation around which the pressable user input mechanism rotates during movement; and
    a sensor subsystem configured to detect three or more actuation states of the pressable user input mechanism.

17. The handheld input device of claim 16, wherein the sensor subsystem includes a magnet attached to the pressable user input mechanism and a Hall effect sensor on an opposing interior surface of the body.

18. The handheld input device of claim 17, wherein the sensor subsystem includes one or more of a plurality of magnets and a plurality of Hall effect sensors.

19. The handheld input device of claim 16, wherein the sensor subsystem includes one or more of a potentiometer and capacitive sensor.

20. The handheld input device of claim 16, further comprising one or more touch sensors positioned to detect touch on a surface of the pressable user input mechanism.

* * * * *